(12) United States Patent
Yamazaki

(10) Patent No.: US 10,528,011 B2
(45) Date of Patent: Jan. 7, 2020

(54) OSCILLATION DEVICE AND TIMEPIECE WITH TEMPERATURE COMPENSATION FUNCTION

(71) Applicant: Seiko Epson Corporation, Tokyo (JP)

(72) Inventor: Yutaka Yamazaki, Okaya (JP)

(73) Assignee: Seiko Epson Corporation (JP)

( * ) Notice: Subject to any disclaimer, the term of this patent is extended or adjusted under 35 U.S.C. 154(b) by 98 days.

(21) Appl. No.: 15/437,743

(22) Filed: Feb. 21, 2017

(65) Prior Publication Data

US 2017/0255167 A1 Sep. 7, 2017

(30) Foreign Application Priority Data

Mar. 4, 2016 (JP) ................................. 2016-041995

(51) Int. Cl.
| | |
|---|---|
| *G04G 3/00* | (2006.01) |
| *G04G 3/04* | (2006.01) |
| *G04B 47/06* | (2006.01) |
| *H03B 5/36* | (2006.01) |

(52) U.S. Cl.
CPC .............. *G04G 3/04* (2013.01); *G04B 47/068* (2013.01); *H03B 5/364* (2013.01)

(58) Field of Classification Search
CPC ......... G04G 3/04; G04B 47/068; H03B 5/364
See application file for complete search history.

(56) References Cited

U.S. PATENT DOCUMENTS

| | | | | |
|---|---|---|---|---|
| 3,828,278 A | * | 8/1974 | Rees | .......................... G04F 5/06 327/437 |
| 4,094,137 A | * | 6/1978 | Morokawa | .............. G04G 19/04 331/116 FE |
| 4,205,518 A | * | 6/1980 | Morokawa | .............. G04G 19/04 331/143 |
| 4,259,715 A | * | 3/1981 | Morokawa | .............. H02M 3/07 331/57 |
| 4,453,834 A | | 6/1984 | Suzuki et al. | |
| 4,454,571 A | * | 6/1984 | Miyashita | ................ G05F 3/205 327/530 |
| 4,761,771 A | | 8/1988 | Moriya et al. | |
| 7,183,868 B1 | * | 2/2007 | Wessendorf | .......... H03K 3/3545 331/116 FE |
| 2013/0082791 A1 | | 4/2013 | Murata et al. | |

FOREIGN PATENT DOCUMENTS

| | | |
|---|---|---|
| JP | 50-131747 A | 10/1975 |
| JP | 58-007584 A | 1/1983 |
| JP | 58-223088 A | 12/1983 |
| JP | 03-213007 A | 9/1991 |

(Continued)

*Primary Examiner* — Sean P Kayes
(74) *Attorney, Agent, or Firm* — Harness, Dickey & Pierce, P.L.C.

(57) ABSTRACT

An oscillation device includes an oscillation circuit configured including an oscillation inverter, and adapted to oscillate a resonator, a frequency adjustment circuit adapted to perform frequency adjustment of the oscillation circuit, and a constant voltage circuit adapted to drive the oscillation circuit, in the oscillation circuit and the frequency adjustment circuit, a gate and a substrate of a field-effect transistor having a connection relationship with one of a gate and a drain of the oscillation inverter are driven with a constant voltage.

13 Claims, 10 Drawing Sheets

(56) References Cited

FOREIGN PATENT DOCUMENTS

| | | |
|---|---|---|
| JP | 06-031731 B2 | 4/1994 |
| JP | H11-097932 A | 4/1999 |
| JP | 11-355043 A | 12/1999 |
| JP | 2004-205244 A | 7/2004 |
| JP | 2004-350203 A | 12/2004 |
| JP | 2008-244617 A | 10/2008 |
| JP | 2013-078082 A | 4/2013 |
| JP | 2014-171158 A | 9/2014 |

* cited by examiner

OSCILLATION DEVICE AND TIMEPIECE WITH TEMPERATURE COMPENSATION FUNCTION

BACKGROUND

1. Technical Field

The present invention relates to an oscillation device and a timepiece with temperature compensation function.

2. Related Art

As a timepiece having such high accuracy as that of an "annual equation" timepiece, there has been known a timepiece with temperature compensation function for correcting the temperature characteristic of a quartz crystal oscillation circuit for outputting a time reference signal (see, e.g., JP-B-6-31731 (Document 1)). Further, there has also been known an oscillation circuit equipped with a frequency adjustment mechanism for adjusting the frequency of the oscillation signal of a quartz crystal oscillation circuit (see, e.g., JP-A-2008-244617 (Document 2)).

In Document 1 and Document 2, load capacitances to be connected to both ends of the quartz crystal resonator and a power supply are switched by control using data written to a nonvolatile memory such as an electrically erasable programmable read-only memory (EEPROM) or a programmable ROM (PROM) or a control signal from a control circuit incorporated in an IC to change the capacitance to thereby change the oscillation frequency.

However, the data from the EEPROM, the PROM, or the like and the control signal from the control circuit are not a signal in a constant voltage level. Therefore, due to a variation of the power supply voltage, the control signal input to a switch or a transmission gate configured using a MOSFET (metal-oxide-semiconductor field-effect transistor) varies.

Since the control signal is applied to the gate of the switch or the transmission gate formed of the MOSFET, the flowability of a current varies due to the variation of the voltage. If the flowability of the current in the switch or the transmission gate varies, there arises a problem that the time for charging the capacitance for adjusting the oscillation frequency varies, and thus, the oscillation frequency varies.

SUMMARY

An advantage of some aspects of the invention is to provide an oscillation device and a timepiece with temperature compensation function, which are capable of suppressing the frequency variation even if the power supply voltage varies.

An oscillation device according to an aspect of the invention includes an oscillation circuit configured including an oscillation inverter, and adapted to oscillate a resonator, a frequency adjustment circuit adapted to perform frequency adjustment of the oscillation circuit, and a constant voltage circuit adapted to drive the oscillation circuit, and in the oscillation circuit and the frequency adjustment circuit, a gate and a substrate of a field-effect transistor having a connection relationship with one of a gate and a drain of the oscillation inverter are driven with a constant voltage.

According to the oscillation device related to this aspect of the invention, the constant voltage is applied to the gate and the substrate of the field-effect transistor having the connection relationship with the gate of the oscillation inverter of the oscillation circuit, and the field-effect transistor having the connection relationship with the drain thereof to thereby drive the field-effect transistors. Therefore, in the field-effect transistor, it is possible to prevent the ON resistance from varying due to the fluctuation in the gate voltage, and it is also possible to prevent the threshold voltage from varying due to the fluctuation in the voltage of the substrate to thereby vary the ON resistance. Therefore, since the change in the ON resistance of the field-effect transistor vanishes, the charge-discharge rate of the oscillation circuit can be made constant, and the oscillation frequency can also be kept constant even if the power supply voltage fluctuates.

In the oscillation device according to the aspect of the invention, it is preferable that the oscillation device further include a control signal output circuit adapted to output a control signal with a constant voltage, the frequency adjustment circuit includes a switch provided with the field-effect transistor connected to one of the gate and the drain of the oscillation inverter, and an adjusting capacitance, connection of which to the oscillation circuit is switched by the switch, the gate of the field-effect transistor used in the switch is connected to the control signal output circuit, and the control signal with the constant voltage is input to the gate of the field-effect transistor used in the switch, and the substrate of the field-effect transistor used in the switch is connected to the constant voltage circuit.

According to the aspect of the invention with this configuration, the frequency adjustment circuit is provided with the switch having the field-effect transistor, and the adjusting capacitance (capacitor), the control signal with the constant voltage is input to the gate of the field-effect transistor from the control signal output circuit, and the constant voltage circuit is connected to the substrate of the field-effect transistor, and the constant voltage is applied to the substrate.

Therefore, in the field-effect transistor as the switch, it is possible to prevent the ON resistance from varying due to the fluctuation in the gate voltage, and it is also possible to prevent the threshold voltage from varying due to the fluctuation in the voltage of the substrate to thereby vary the ON resistance. Therefore, in the case in which the field-effect transistor is kept to the ON state in order to connect the adjusting capacitance, if the power supply voltage fluctuates, since the ON resistance of the field effect transistor does not fluctuate, it is also possible to prevent the oscillation frequency from fluctuating.

In the oscillation device according to the aspect of the invention, it is preferable that the switch is formed of a transmission gate having a P-channel MOSFET and an N-channel MOSFET connected in parallel to each other, the adjusting capacitance is connected in series between the transmission gate and a ground, a gate of the P-channel MOSFET is connected to the control signal output circuit, and a first control signal with a constant voltage is input to the gate of the P-channel MOSFET, a voltage with a higher potential out of a constant voltage VREG applied from the constant voltage circuit and a ground potential is applied to a substrate of the P-channel MOSFET, a gate of the N-channel MOSFET is connected to the control signal output circuit, and a second control signal with a constant voltage obtained by reversing the first control signal is input to the gate of the N-channel MOSFET, and a voltage with a lower potential out of the constant voltage VREG applied from the constant voltage circuit and the ground potential is applied to a substrate of the N-channel MOSFET.

According also to the aspect of the invention with this configuration, substantially the same advantages as in the oscillation device described above can be obtained. Further, since the transmission gate is used as the switch, if the potential difference between the gate and the source of the transistor used for the transmission gate varies by charging the adjusting capacitance (capacitor), and as a result, one of the transistors operates in the weak inversion region, the other transistor can operate in the strong inversion region. Therefore, the switch operation can be performed at a high speed.

Further, in the weak inversion region, there occurs a significant difference in the flowability of the current due to the variation in the threshold voltage of the transistor. However, since the other of the transistors operates in the strong inversion region when the one of the transistors operates in the weak inversion region, it becomes possible to suppress the influence of the variation in the threshold voltage of the transistor.

In the oscillation device according to the aspect of the invention, it is preferable that the oscillation circuit is configured including the field-effect transistor used as a feedback resistor, and the gate and the substrate of the field-effect transistor used as the feedback resistor are driven with a constant voltage applied by the constant voltage circuit.

According to the aspect of the invention with this configuration, since the field-effect transistor is used as the feedback resistor, it is possible to make the circuit smaller compared to the case of using a pure resistor connected to the outside of the IC, or a resistor formed of polysilicon or a resistor formed of a diffused resistor inside the IC as a feedback resistor.

In the oscillation device according to the aspect of the invention, it is preferable that the frequency adjustment circuit is configured including the field-effect transistor, and a sign of gradient of a temperature characteristic of a threshold voltage of the field-effect transistor and a sign of gradient of a temperature characteristic of the constant voltage output by the constant voltage circuit coincide with each other.

Since the sign of gradient of the temperature characteristic of the threshold voltage of the field-effect transistor and the sign of gradient of the temperature characteristic of the constant voltage of the constant voltage circuit are made the same, the variation in resistance component of the frequency adjustment circuit when the temperature has changed becomes small. Therefore, even if the temperature has changed, the fluctuation in the frequency adjustment amount by the frequency adjustment circuit can be suppressed, and the fluctuation in the oscillation frequency can also be made small.

A timepiece with temperature compensation function according to another aspect of the invention includes any one of the oscillation devices described above, a temperature sensor adapted to output temperature information, an arithmetic circuit adapted to calculate a correction amount based on the temperature information, a frequency adjustment control circuit adapted to control the frequency adjustment circuit based on the correction amount, and a time display section adapted to display time based on an oscillation signal output from the oscillation device.

According to this aspect of the invention, since the fluctuation in the frequency of the oscillation signal output from the oscillation device can be suppressed even if the power supply voltage has fluctuated, the correction amount based on the temperature information detected by the temperature sensor becomes accurate irrespective of the power supply voltage, and it is possible to output the oscillation signal small in frequency fluctuation until the terminal stage of discharge of the battery. Therefore, the time display accuracy of the time display section driven based on the oscillation signal can also be kept high.

Further, in the GPS radio clock or the like, which receives the radio wave to keep the high accuracy, metal materials cannot be used for the dial of the clock in order to receive the radio wave, and it is necessary to use a material such as plastic having a texture similar to metal.

However, since the timepiece with temperature compensation function according to the invention can achieve the high accuracy by itself, there is no need to receive the radio wave, and there is no restriction on the dial of the clock unlike the GPS radio clock. Therefore, the dial made of metal can be used to provide the appearance extremely superior in texture, and thus, it is possible to extremely increase the satisfaction level of the user of the timepiece.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
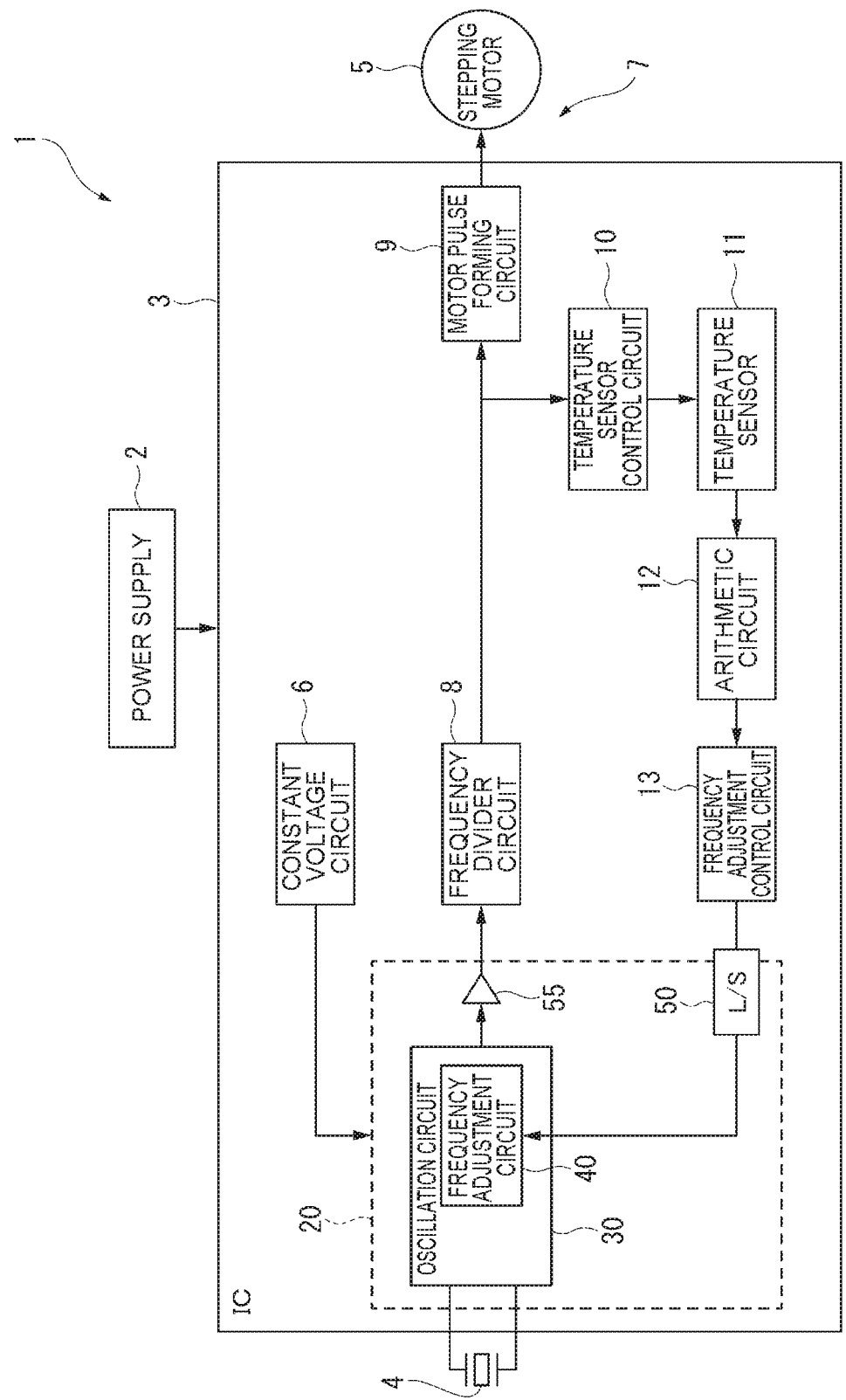
FIG. 1 is a block diagram showing a configuration of a timepiece with temperature compensation function according to a first embodiment of the invention.

The first embodiment of the invention will be described based on the accompanying drawings. In FIG. 1, there is shown the block diagram showing the configuration of the timepiece with temperature compensation function 1 according to the first embodiment of the invention.

Timepiece with Temperature Compensation Function

The timepiece with temperature compensation function 1 is provided with a power supply 2, a timepiece IC 3 driven with the power supply 2, a quartz crystal resonator 4, and a stepping motor 5.

The power supply 2 is formed of a primary cell or a secondary cell. It should be noted that in the case of using the secondary cell, it is sufficient to provide the timepiece with temperature compensation function 1 with a generator for charging the secondary cell, or to provide a configuration in which the timepiece with temperature compensation function 1 can be charged from the outside. As the generator, there can be used a generator for timepiece such as a solar cell or a generator for generating electricity with a rotary weight.

It should be noted that in the present embodiment, VSS (the low voltage side) is defined as the reference potential (the ground potential: GND), and VDD (the high voltage side) is defined as the power supply voltage.

The stepping motor 5 drives hands such as a minute hand, a second hand, and an hour hand via a gear train not shown. Therefore, the timepiece with temperature compensation function 1 is an analog-type timepiece.

The timepiece IC 3 is provided with a constant voltage circuit 6, an oscillation device 20, a frequency divider circuit 8, a motor pulse forming circuit 9, a temperature sensor control circuit 10, a temperature sensor 11, an arithmetic circuit 12, and a frequency adjustment control circuit 13.

The oscillation device 20 is provided with an oscillation circuit 30, a frequency adjustment circuit 40, a level shifter (L/S) 50, and a waveform shaping circuit 55.

Figure 2:
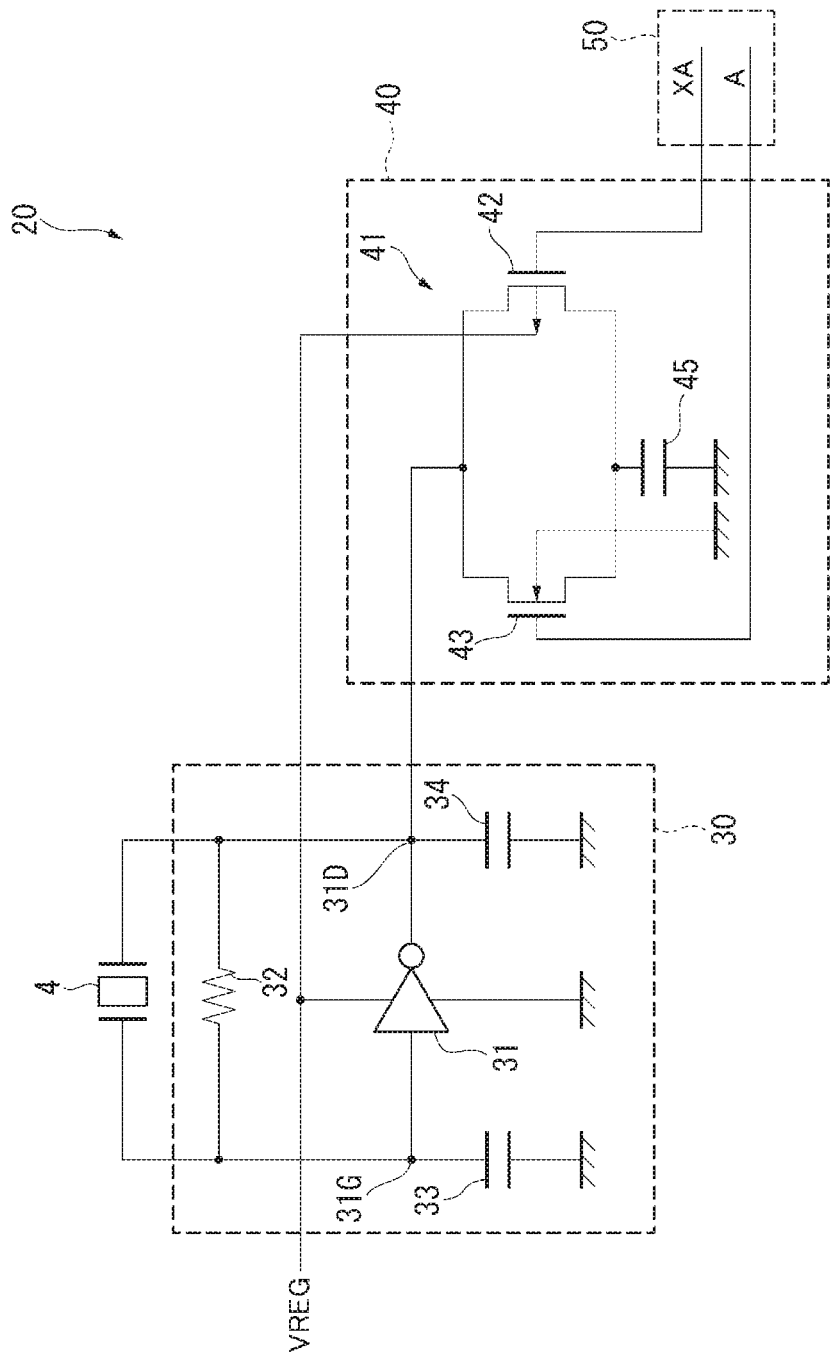
FIG. 2 is a circuit diagram showing a configuration of an oscillation device according to the first embodiment.

As shown in FIG. 2, the oscillation circuit 30 is a general circuit for oscillating the quartz crystal resonator 4, and is provided with an oscillation inverter 31, a feedback resistor 32, a gate capacitor 33, and a drain capacitor 34.

The constant voltage circuit 6 converts the power supply voltage VDD of the power supply 2 into the constant voltage VREG, and then supplies the oscillation device 20 with the constant voltage VREG.

The oscillation circuit 30 of the oscillation device 30 drives the quartz crystal resonator 4 as an oscillation source to output the oscillation signal of 32 kHz (32,768 Hz) to be the original vibration to the waveform shaping circuit 55. On this occasion, the frequency of the oscillation signal is adjusted by the frequency adjustment circuit 40 described later.

The waveform shaping circuit 55 is formed of a waveform shaping inverter or the like, and shapes the oscillation signal output from the oscillation circuit 30, and then outputs the result to the frequency divider circuit 8 as a clock signal.

The frequency divider circuit 8 is a general frequency divider circuit used in the timepiece IC 3, and is provided with a plurality of frequency dividers, and divides the frequency of the oscillation signal to a certain frequency (e.g., 1 Hz), and then outputs the result as a reference signal to be the reference of the time measurement.

The motor pulse forming circuit 9 forms a motor pulse for driving the stepping motor 5 using the signal output from the frequency divider circuit 8, and then outputs the motor pulse. The motor pulse is output from the motor pulse forming circuit 9 to the stepping motor 5, and thus the stepping motor 5 is driven. Due to the drive of the stepping motor 5, the hands are moved via the gear train, and thus, the time is displayed. Therefore, a time display section 7 is configured including the motor pulse forming circuit 9, the stepping motor 5, the gear train not shown, and the hands.

The clock signal output from the frequency divider circuit 8 is also input to the temperature sensor control circuit 10. The temperature sensor control circuit 10 drives the temperature sensor 11 at a predetermined timing due to the input of the clock signal.

The temperature sensor 11 is configured using, for example, a CR oscillation circuit, and measures the temperature of a space (inside a timepiece case) in which the timepiece IC 3 is disposed based on the oscillation frequency varying due to the temperature characteristic of the CR oscillation circuit.

The output (the temperature information) of the temperature sensor 11 is input to the arithmetic circuit 12. The arithmetic circuit 12 calculates a correction amount of the frequency of the oscillation signal output from the oscillation device 20 based on the temperature (e.g., the oscillation frequency of the CR oscillation circuit) measured by the temperature sensor 11, and then inputs the calculation result to the frequency adjustment control circuit 13. The frequency adjustment control circuit 13 outputs the control signal for controlling the frequency adjustment circuit 40 based on the calculation result described above.

The control signal performs the control so as to change the ratio between the time during which an adjusting capacitance (capacitor) 45 is connected to the drain 31D and the time during which the adjusting capacitance 45 is not connected to the drain 31D within a predetermined time. Thus, the frequency adjustment circuit 40 can finely adjust the average frequency within a predetermined time of the oscillation signal output from the oscillation circuit 30. Further, even if there is no space for disposing a plurality of adjusting capacitances (capacitors) 45, it is possible to adjust the frequency with a single adjusting capacitance (capacitor) 45.

It should be noted that although not shown in the drawings, it is also possible to finely adjust the frequency of the oscillation signal output from the oscillation circuit 30 by providing a plurality of frequency adjustment circuits, and varying the number of adjusting capacitances (capacitors) 45 to be connected to the oscillation circuit 30. It should be noted that in the case of using the plurality of frequency adjustment circuits, the control signal becomes necessary for each of the frequency adjustment circuits, and the frequency adjustment control circuit 13 outputs the control signals capable of individually controlling each of the frequency adjustment circuits.

The control signal output from the frequency adjustment control circuit 13 is made to have a constant voltage by the level shifter 50, and is then input to the frequency adjustment circuit 40. Therefore, the level shifter 50 is a control signal output circuit according to the invention, and outputs a first control signal XA having a constant voltage and a second control signal A having a constant voltage.

The oscillation device 20 outputs the oscillation signal with a frequency adjusted by the frequency adjustment circuit 40.

As shown in FIG. 2, in the oscillation circuit 30 of the oscillation device 20, the gate 31G of the oscillation inverter 31 is connected to the gate capacitor (gate capacitance) 33, the feedback resistor 32, and the quartz crystal resonator 4. Further, the drain 31D of the oscillation inverter 31 is connected to the drain capacitor (drain capacitance) 34, the feedback resistor 32, the quartz crystal resonator 4, and the frequency adjustment circuit 40.

The frequency adjustment circuit 40 is constituted by a transmission gate 41 and the adjusting capacitance (capacitor) 45 connected in series to the transmission gate 41. The transmission gate 41 is a switch for switching between the state in which the adjusting capacitance 45 is connected to the drain 31D of the oscillation inverter 31, and the state in which the adjusting capacitance 45 is separated therefrom. All of the signals applied to the gate of the transmission gate 41 used for the switch and the substrate are signals each made to have a constant voltage.

The transmission gate 41 is constituted by two field-effect transistors used for the switch and connected in parallel to each other. Specifically, the transmission gate 41 is constituted by a P-channel (Pch) field-effect transistor (MOSFET) 42 and an N-channel (Nch) field-effect transistor (MOSFET) 43 connected in parallel to each other. To the substrate of the Pch field-effect transistor 42, there is supplied (connected) the constant voltage VREG with high potential among the constant voltage VREG with high potential and the constant voltage VSS with low potential output by the constant voltage circuit 6. To the gate of the field-effect transistor 42, there is input the first control signal XA made to have a constant voltage by the level shifter 50.

Further, to the substrate of the Nch field-effect transistor 43, there is connected the constant voltage VSS with low potential, and to the gate, there is input the second control signal A made to have a constant voltage by the level shifter 50. It should be noted that the first control signal XA is a signal obtained by reversing the second control signal A.

Therefore, it results that in the oscillation device 20, the gates and the substrates of all of the field-effect transistors 42, 43 having a connection relationship with the gate 31G or the drain 31D of the oscillation inverter 31 are driven with a constant voltage. It should be noted that the field-effect transistors having the connection relationship with the gate 31G or the drain 31D denote the field-effect transistor electrically connected to the gate 31G, and the field-effect transistor electrically connected to the drain 31D. Therefore, in the oscillation device 20 shown in FIG. 2, the two field-effect transistors 42, 43 constituting the transmission gate 41 of the frequency adjustment circuit 40 correspond to such field-effect transistors in the oscillation device 20 shown in FIG. 2.

Figure 3:
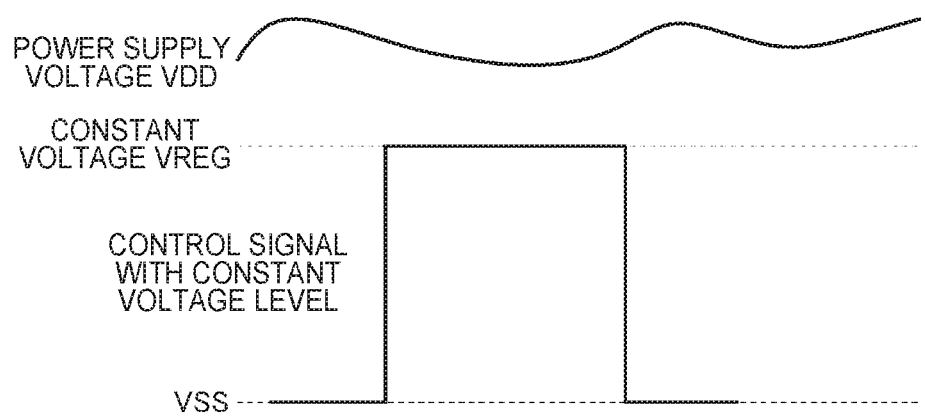
FIG. 3 is a diagram showing a relationship between a constant voltage output by a constant voltage circuit of the first embodiment and a power supply voltage.

As shown in FIG. 3, the constant voltage VREG output by the constant voltage circuit 6 has a voltage level lower than the power supply voltage VDD, and even if the power supply voltage VDD fluctuates, the constant voltage VREG is kept at the constant voltage level. The voltage VSS is the ground voltage, and is therefore a constant voltage. The control signals A, XA output from the level shifter 50 are similarly kept at a constant voltage level (the H level or the L level) even if the power supply voltage VDD fluctuates.

Therefore, since the gate voltage of the transmission gate 41 is kept constant even if the power supply voltage fluctuates, the fluctuation in the ON resistance due to the fluctuation in the gate voltage can be prevented. Similarly, since the voltage of the substrate does not fluctuate, it is also possible to prevent the threshold voltage Vth from changing due to the fluctuation in the voltage of the substrate, and thus it is possible to prevent the ON resistance from changing. Further, since the change in the ON resistance of the transmission gate 41 vanishes, the charge-discharge rate of the oscillation circuit 30 does not change, and the oscillation frequency can be kept constant.

Further, the relationship between the constant voltage VREG output by the constant voltage circuit 6 and the temperature is set to have the same sign of gradient as the sign of gradient of the temperature characteristic of the threshold voltage Vth of the field-effect transistors 42, 43 of the transmission gate 41 used in the frequency adjustment circuit 40.

Figure 4:
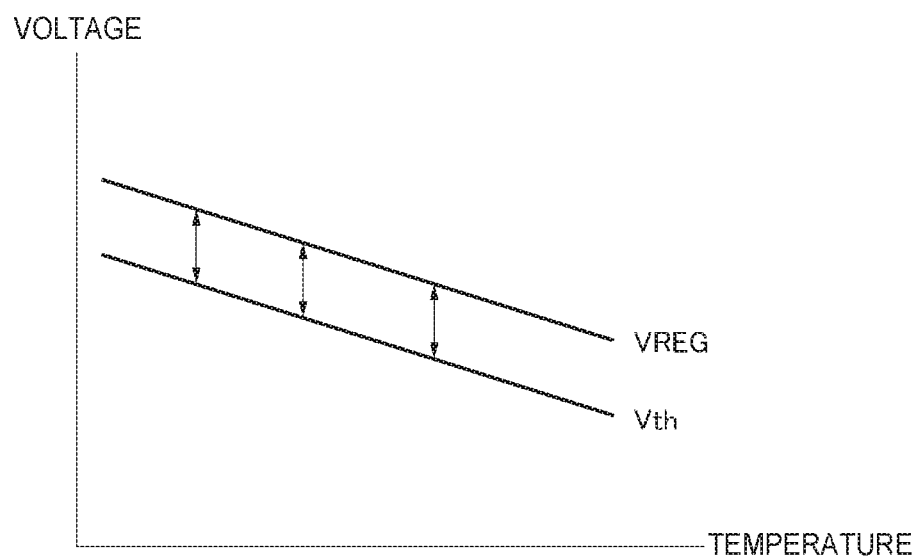
FIG. 4 is a graph showing a relationship between a constant voltage VREG output by the constant voltage circuit of the first embodiment and a threshold voltage Vth of a field-effect transistor.

As shown in FIG. 4, in the case in which the temperature characteristic of the threshold voltage Vth of the field-effect transistors 42, 43 is set to have the gradient (the sign of gradient is "−") that the threshold voltage Vth drops as the temperature rises, it is sufficient for the temperature characteristic of the constant voltage circuit 6 to be set to have the gradient (the sign of gradient is "−") that the constant voltage VREG drops as the temperature rises.

If the temperature characteristic of the threshold voltage Vth has the opposite direction (the sign of gradient is "+"), it is sufficient for the temperature characteristic of the constant voltage circuit 6 to be set to have the opposite direction (the sign of gradient is "+").

In the frequency adjustment circuit 40, the current Id flowing through the transmission gate 41 as the switch for switching the adjusting capacitance 45 is expressed as the following formula in the saturated region.

$$Id = \frac{1}{2} \times \beta (Vgs - Vth)^2 = \frac{1}{2} \times \beta (VREG - Vth)^2$$

Therefore, even in the case in which the temperature changes, if the difference of VREG−Vth is constant, the current Id also becomes constant, and thus, the variation in the resistance component of the frequency adjustment circuit 40 can be made small. Therefore, as shown in FIG. 4, if the signs of gradient of the temperature characteristics coincide with each other, the variation of the difference of VREG−Vth is also made small, and thus, the change in resistance component of the frequency adjustment circuit 40 can be made small.

Figure 5:
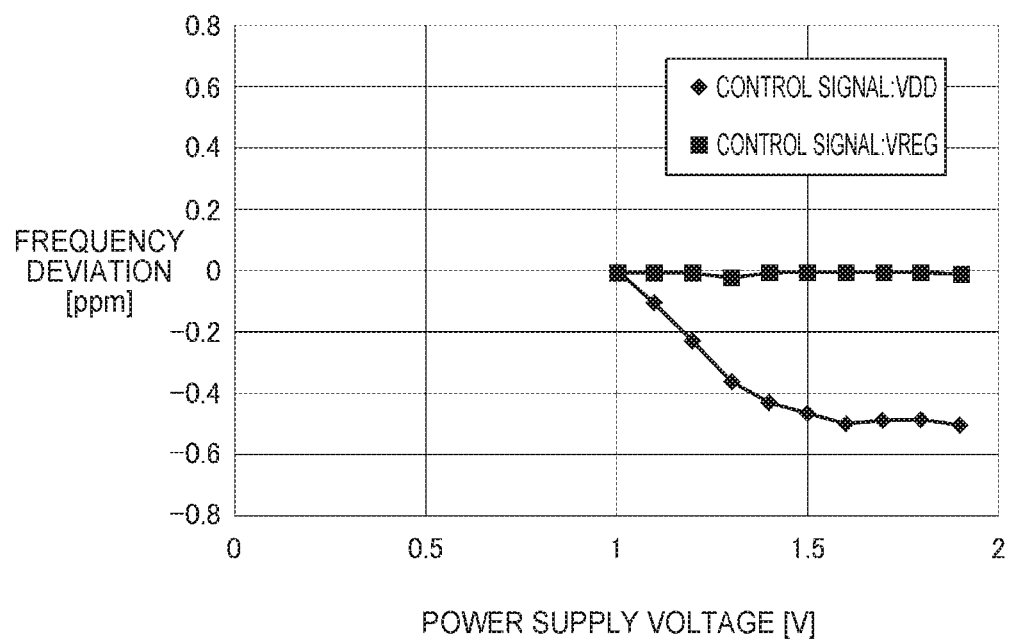
FIG. 5 is a graph showing a frequency deviation in the case of using a control signal with the constant voltage VREG as a control signal to be input to the gate of the field-effect transistor, and a frequency deviation in the case of using a control signal with the power supply voltage VDD.

FIG. 5 shows the change in the oscillation frequency when the transmission gate 41 is in the ON state in the case of varying the power supply voltage up to 1.9 V with reference to 1.0V comparing between the example of the first embodiment using the control signal with the constant voltage VREG and a comparative example using the control signal with the power supply voltage VDD.

In the case of using the control signal with the power supply voltage VDD, in particular, in the range in which the power supply voltage rises from 1.0 V to 1.5 V, the frequency deviation also changes dramatically.

In contrast, in the case of the present embodiment in which the control signal with the constant voltage VREG is used, even if the power supply voltage varies in the range of 1.0 V through 1.9 V, the frequency deviation hardly changes, and the oscillation frequency can be kept roughly constant.

Advantages of First Embodiment

According to the first embodiment described above, the following advantages can be obtained.

1. Since the constant voltage is applied to the gate and the substrate of the field-effect transistors 42, 43 having the connection relationship with the gate 31G or the drain 31D of the oscillation inverter 31 to drive the field-effect transistors 42, 43, even if the power supply voltage fluctuates, the fluctuation in the oscillation frequency of the oscillation circuit 30 can be suppressed, and thus, the oscillation signal with a constant frequency can be output.

2. According to the present embodiment, since the oscillation frequency does not fluctuate if the power supply voltage fluctuates, the correction amount due to the temperature becomes correct without being affected by the power supply voltage. Therefore, the timepiece with temperature compensation function 1 can keep the high accuracy until the terminal stage of discharge of the battery, and can therefore be used as an annual equation timepiece.

3. Since the threshold voltage Vth of the field-effect transistors 42, 43 and the constant voltage VREG of the constant voltage circuit 6 are made the same in the sign of gradient of the temperature characteristic, the variation in resistance component of the frequency adjustment circuit 40 when the temperature has changed becomes small. Therefore, it is possible for the frequency adjustment circuit 40 to obtain the desired frequency adjustment amount even if the temperature has changed.

Second Embodiment

Figure 6:
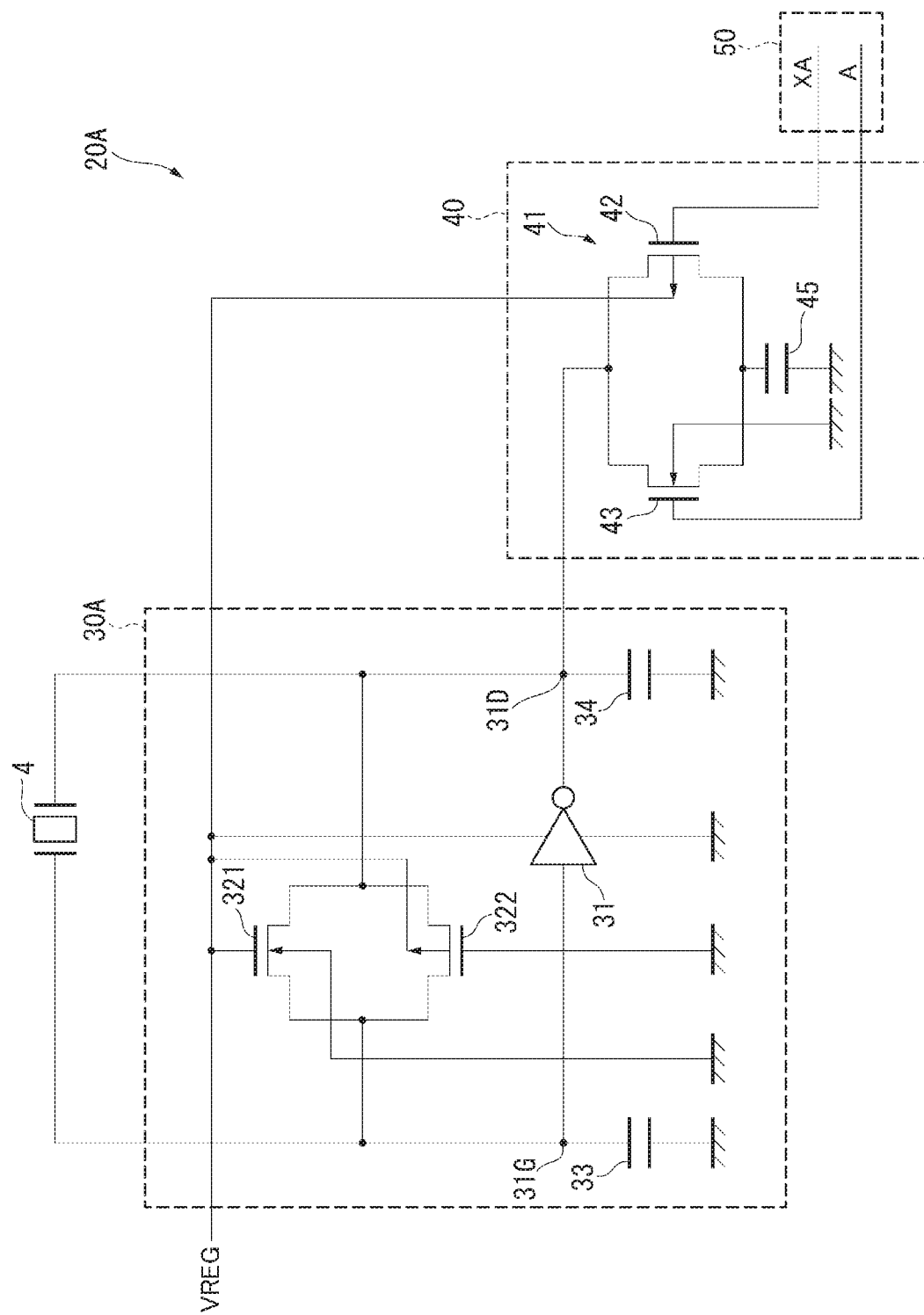
FIG. 6 is a circuit diagram showing a configuration of an oscillation device according to a second embodiment of the invention.

FIG. 6 is a block diagram showing a configuration of an oscillation device 20A according to the second embodiment of the invention.

The oscillation device 20A is a device using two field-effect transistors 321, 322 as the feedback resistors in the oscillation circuit 30A. Since these field-effect transistors 321, 322 for the feedback resistors are also connected to the gate 31G and the drain 31D of the oscillation inverter 31, the constant voltage is applied to the gate and the substrate thereof.

Specifically, the constant voltage VREG is applied to the gate of the field-effect transistor 321, and the constant voltage VSS is applied to the substrate thereof. Further, the constant voltage VSS is applied to the gate of the field-effect transistor 322, and the constant voltage VREG is applied to the substrate thereof.

It should be noted that since the oscillation device 20A is the same as the oscillation device 20 except the point that the feedback resistors in the oscillation circuit 30A are formed of the field-effect transistors 321, 322, the other constituents are denoted by the same reference symbols, and the explanation thereof will be omitted.

Advantages of Second Embodiment

In the oscillation device 20A according to the second embodiment, the field-effect transistors 321, 322 are provided as the feedback resistors in the oscillation circuit 30A, the constant voltage VREG and the constant voltage VSS are applied to the gates thereof, and the constant voltage VSS and the constant voltage VREG are applied to the substrate thereof. Therefore, even if the power supply voltage VDD fluctuates, the threshold voltage Vth does not fluctuate, and the ON resistance does not also fluctuate, and therefore, it is possible to prevent the feedback resistance value from changing. Therefore, even if the power supply voltage fluctuates, there is no chance for the power of the oscillation circuit 30A to change, and therefore, it is also possible to prevent the oscillation frequency of the oscillation circuit 30A from changing.

Further, since the field-effect transistors 321, 322 are used as the feedback resistors, the circuit scale of the oscillation device 20A can be made small. Specifically, by using the field-effect transistors 321, 322, it is possible to make the circuit smaller compared to the case of using a pure resistor connected to the outside of the timepiece IC 3, or a resistor formed of polysilicon or a resistor formed of a diffused resistor inside the IC as a feedback resistor.

Modified Examples

It should be noted that the invention is not limited to the embodiments described above, but includes other configurations capable of achieving the advantages of the invention. Such modified examples as described below are also included in the invention.

Figure 7:
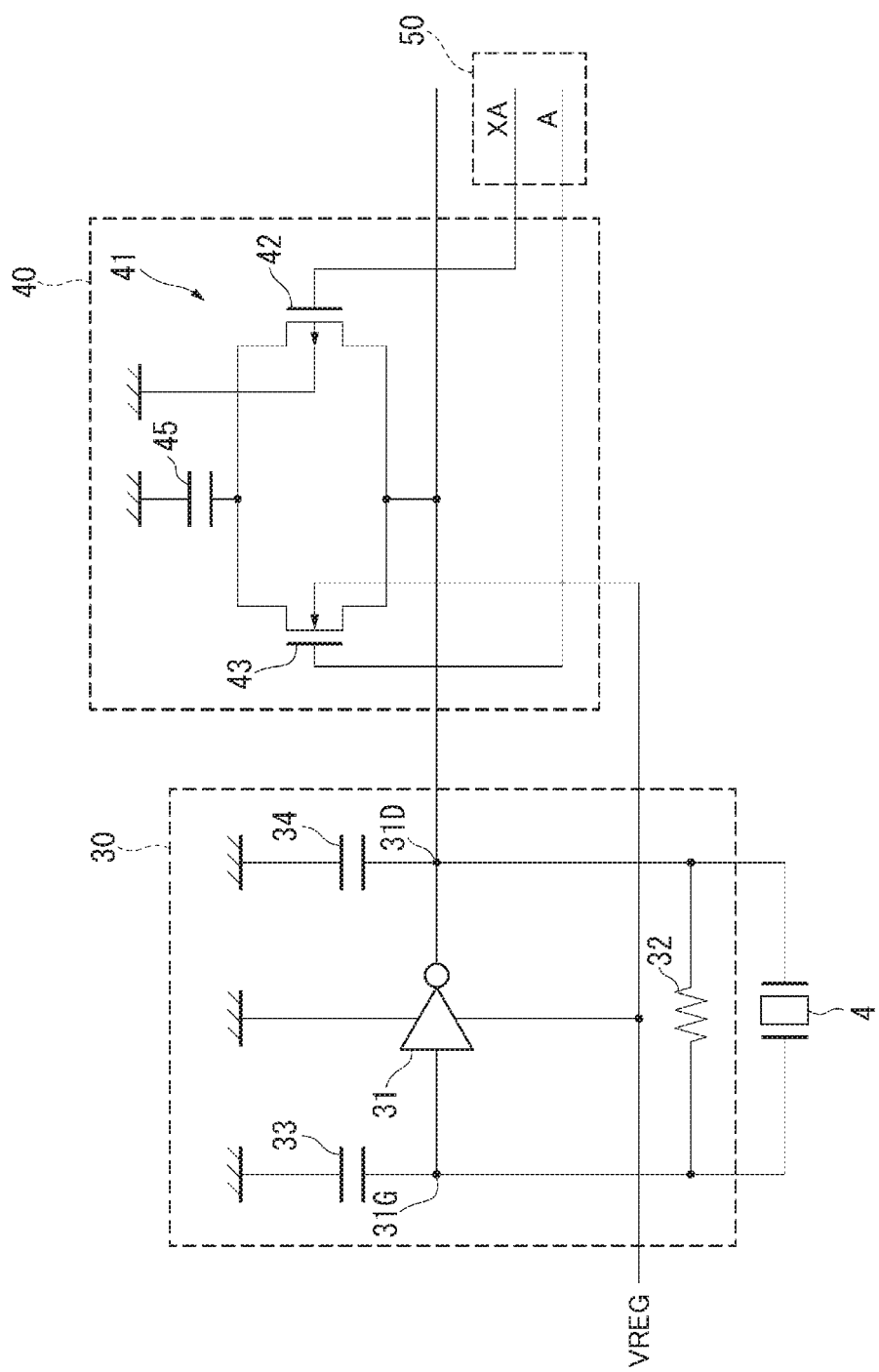
FIG. 7 is a circuit diagram showing a configuration of an oscillation device according to a modified example of the invention.

For example, although in each of the embodiments described above, there is described the case in which the constant voltage VSS is defined as the ground, the same advantages can also be obtained even in the case in which the constant voltage VDD is defined as the ground. For example, in the configuration of the first embodiment, in order to define the constant voltage VDD as the ground, it is sufficient to adopt the circuit shown in FIG. 7. It should be noted that although not shown in the drawings, the constant voltage VDD can be defined as the ground also in the second embodiment.

Further, the relationship between the constant voltage VREG output by the constant voltage circuit 6 and the temperature is set to have the same sign of gradient as the sign of gradient of the temperature characteristic of the threshold voltage Vth of the field-effect transistors 42, 43, but is not limited to this configuration. It should be noted that if the difference between the constant voltage VREG and the threshold voltage Vth when the temperature has changed is constant, there is an advantage that the variation in the resistance component of the frequency adjustment circuit 40 can be made small, and the desired frequency adjustment amount can be made easy to obtain as described above.

The field-effect transistor having the connection relationship with the gate 31G or the drain 31D of the oscillation inverter 31 is not limited to the transistor constituting the transmission gate 41 of the frequency adjustment circuit 40 or the transistor used as the feedback resistance. For example, it is also possible to use the field-effect transistor in the case of disposing the drain resistor of the oscillation inverter 31.

Further, the field-effect transistor used for the switch of the frequency adjustment circuit 40 is not limited to the CMOS transmission gate 41 of the embodiments described above, but can also be a transistor using only the Pch MOSFET, or a transistor using only the Nch MOSFET.

Figure 8:
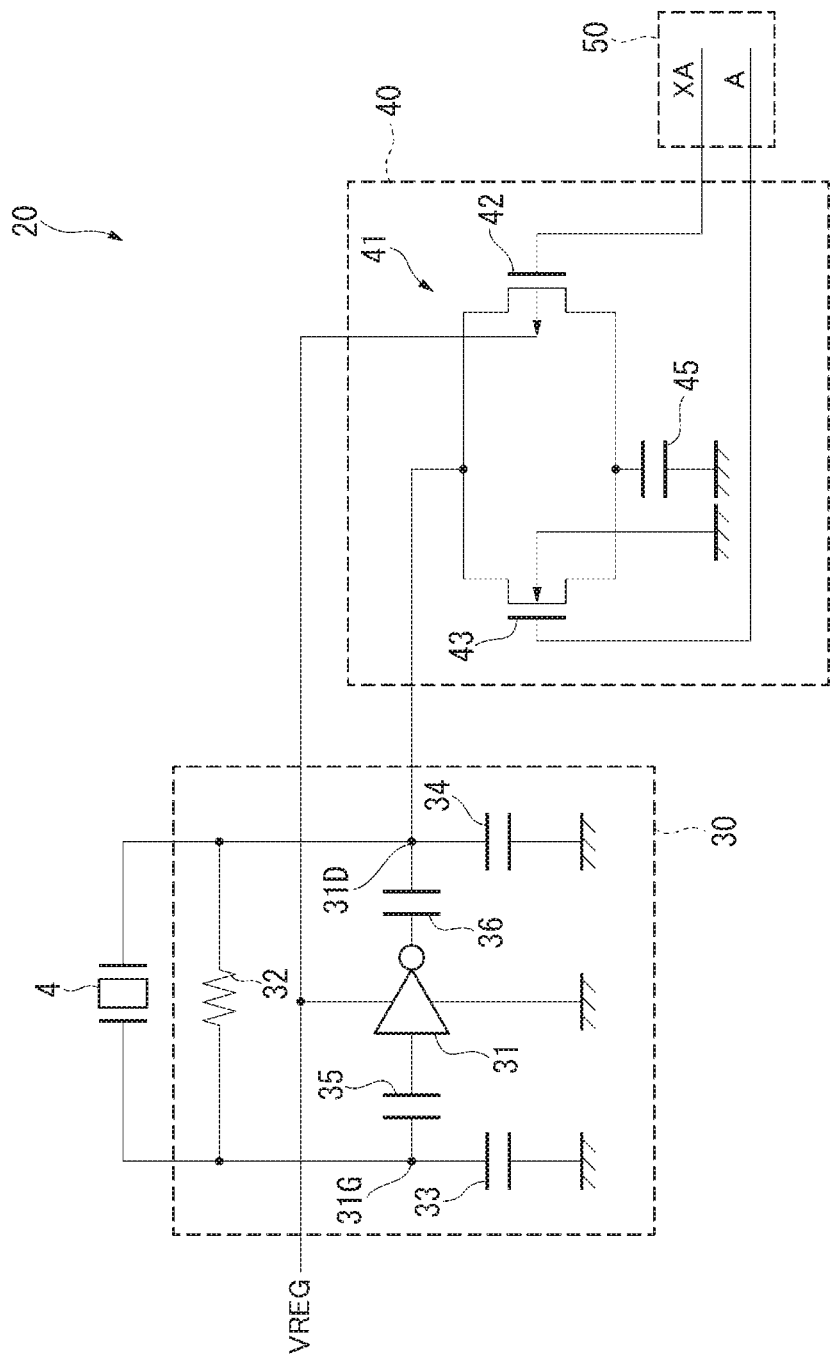
FIG. 8 is a circuit diagram showing another modified example of the invention.
Figure 9:
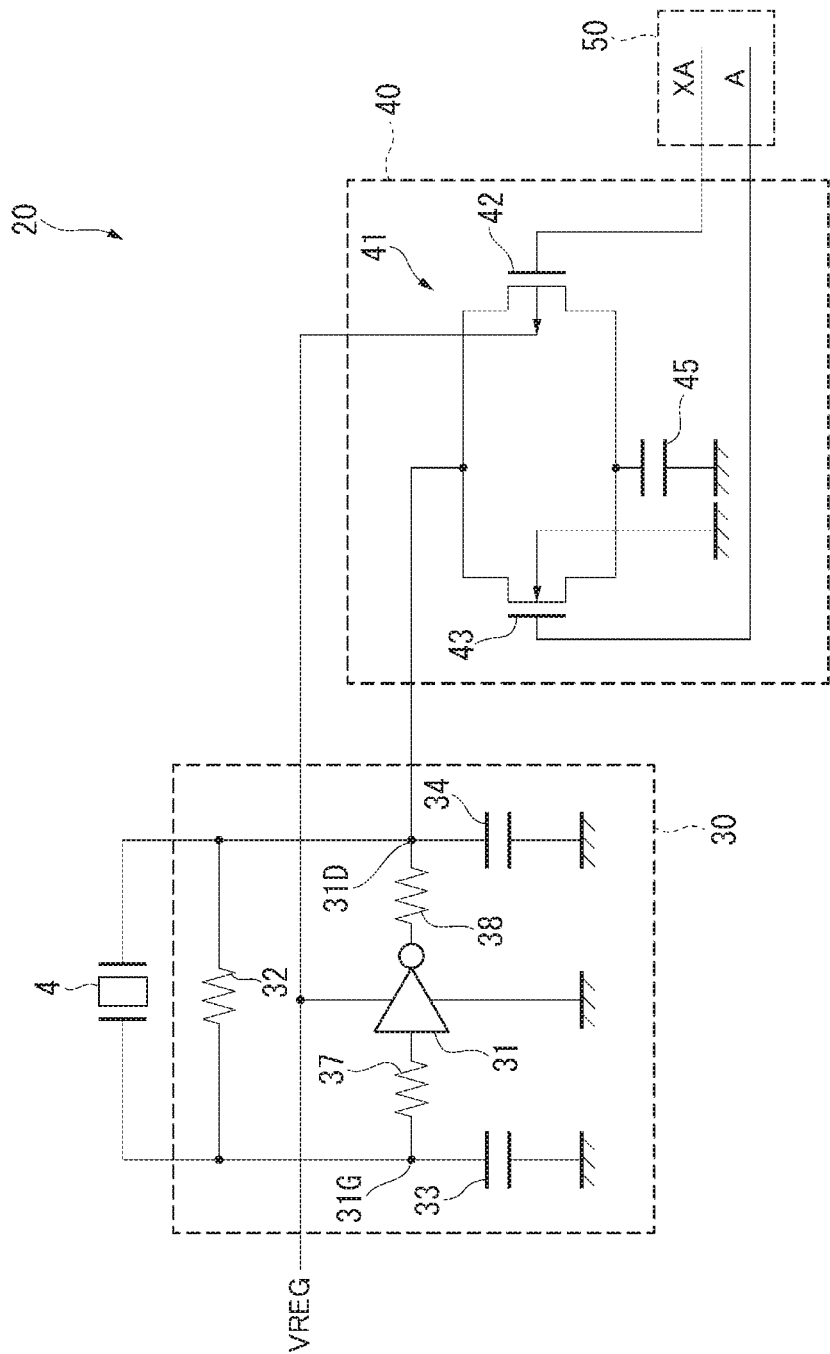
FIG. 9 is a circuit diagram showing another modified example of the invention.
Figure 10:
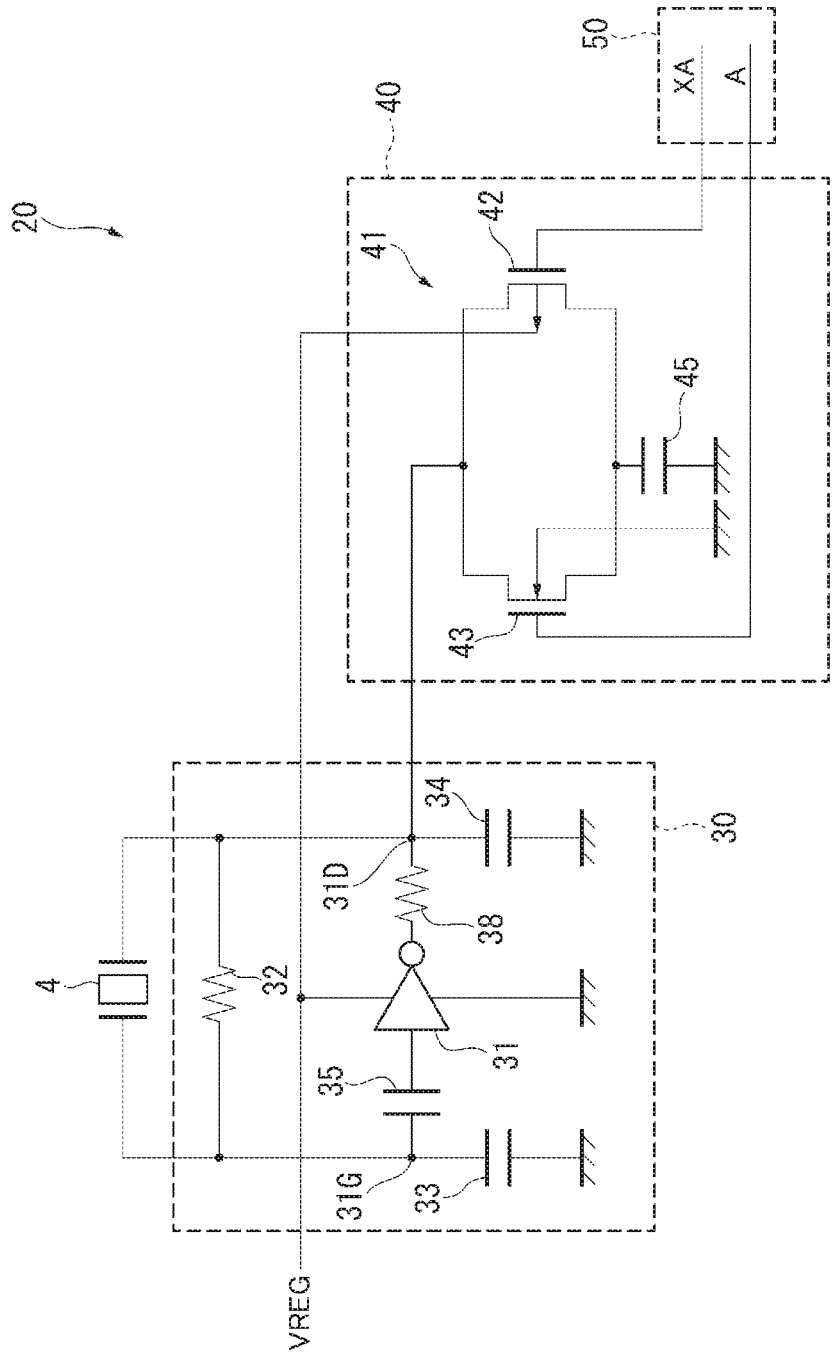
FIG. 10 is a circuit diagram showing another modified example of the invention.

As the gate 31G and the drain 31D, those set on the input side or the output side of the circuit elements such as the capacitors 35, 36 and the resistors 37, 38 for adjusting the characteristic of the oscillation inverter 31 are included as shown in FIGS. 8 through 10. In other words, the gate 31G of the oscillation inverter 31 includes those set on the input side of the circuit elements disposed on the input side of the oscillation inverter 31, and the drain 31D includes those set on the output side of the circuit elements disposed on the output side of the oscillation inverter 31.

For example, as shown in FIG. 8, in the case of disposing the capacitors 35, 36 on the input side and the output side of the oscillation inverter 31, the gate 31G is set on the input side of the capacitor 35, and the drain 31D is set on the output side of the capacitor 36. It should be noted that although not shown in the drawings, in the circuit in which only the capacitor 35 on the input side of the oscillation inverter 31 is disposed but the capacitor 36 is not disposed, and the circuit in which only the capacitor 36 on the output side of the oscillation inverter 31 is disposed but the capacitor 35 is not disposed, the gate 31G and the drain 31D are set similarly.

In the case of disposing the capacitors 35, 36 on the input side and the output side of the oscillation inverter 31, the following advantages are obtained.

That is, the IC is mounted on a board or the like, and due to the long term use, the impedance of the board gradually deteriorates, and the board becomes easy to conduct the electricity. Then, the gate 31G and the drain 31D to which the quartz crystal resonator 4 is connected are pulled up or pulled down to the high potential side potential or the low potential side potential of the power supply voltage via the board. Then, it results that the input and output waveforms of the oscillation inverter 31 (the oscillation waveforms) are pulled toward the high potential side or the low potential side, and thus, the oscillation waveforms are distorted, and there is a possibility that the oscillation stops.

In order to prevent the above, the capacitors 35, 36 are disposed on the input side and the output side of the oscillation inverter 31 as the DC cut capacitors. If the DC cut capacitors are disposed, since the direct-current component is cut, the input and output waveforms (the oscillation waveforms) of the oscillation inverter 31 are prevented from being distorted, and thus the oscillation can be prevented from stopping. Therefore, there is an advantage that the long-term reliability can be improved.

Further, as shown in FIG. 9, in the case of disposing the resistors 37, 38 on the input side and the output side of the oscillation inverter 31, the gate 31G is set on the input side of the resistor 37, and the drain 31D is set on the output side of the resistor 38. It should be noted that although not shown in the drawings, in the circuit in which only the resistor 37 on the input side of the oscillation inverter 31 is disposed but the resistor 38 is not disposed, and the circuit in which only the resistor 38 on the output side of the oscillation inverter 31 is disposed but the resistor 37 is not disposed, the gate 31G and the drain 31D are set similarly.

In the case of disposing the resistors 37, 38 on the input side and the output side of the oscillation inverter 31, the following advantages are obtained.

The quartz crystal resonator 4 can oscillate with a triple or fivefold frequency if the power of the oscillation circuit 30 is high. In other words, if the power is too high, the quartz crystal resonator 4 oscillates with the harmonic frequency instead of the desired frequency in some cases, and the stable oscillation cannot be obtained.

Therefore, in order to adjust the power of the oscillation circuit 30, the gate resistor 37 and the drain resistor 38 are inserted. Thus, there is an advantage that the desired oscillation frequency can stably be obtained. It should be noted that it is also possible to constitute these resistors 37, 38 by the field-effect transistors, and since these field-effect transistors are the field-effect transistors having the connection relationship with the gate 31G or the drain 31D, it is sufficient to drive the gate and the substrate with the constant voltage.

Further, it is also possible to dispose the capacitor and the resistor on the input side and the output side of the oscillation inverter 31. For example, as shown in FIG. 10, it is also possible to dispose the capacitor 35 on the input side of the oscillation inverter 31, and to dispose the resistor 38 on the output side. Further, although not shown in the drawings, it is also possible to dispose the resistor 37 on the input side of the oscillation inverter 31, and to dispose the capacitor 36 on the output side. In these cases, the gate 31G is set on the input side of the capacitor 35 and the resistor 37, and the drain 31D is set on the output side of the capacitor 36 and the resistor 38.

Therefore, the field-effect transistor having the connection relationship with the gate 31G of the oscillation inverter 31 is not limited to those directly connected to the input side of the oscillation inverter 31, but includes the field-effect transistors connected via the circuit elements for the oscillation inverter 31 such as the capacitor 35 and the resistor 37. Further, the field-effect transistor having the connection relationship with the drain 31D of the oscillation inverter 31 is not limited to those directly connected to the output side of the oscillation inverter 31, but includes the field-effect transistors connected via the circuit elements for the oscillation inverter 31 such as the capacitor 36 and the resistor 38. Further, in the case in which the circuit elements for the oscillation inverter 31, for example the resistors 37, 38, are each formed of the field-effect transistor, the field-effect transistors used as the circuit elements for the oscillation inverter 31 are also included.

The entire disclosure of Japanese Patent Application No. 2016-041995, filed Mar. 4, 2016 is expressly incorporated by reference herein.

What is claimed is:

1. An oscillation device comprising:
   a quartz crystal resonator;
   an oscillation circuit that is configured to oscillate the quartz crystal resonator and includes
   an oscillation inverter having a gate connected to one terminal of the quartz crystal resonator and a drain connected to another terminal of the quartz crystal resonator, and
   a frequency adjustment circuit that is configured to perform frequency adjustment of the oscillation circuit and includes:
   a switch provided with a field-effect transistor connected to one of the gate and the drain of the oscillation inverter; and
   an adjusting capacitance, wherein a connection of the adjusting capacitance to the oscillation circuit is switched by the switch; and
   a constant voltage circuit configured to drive the oscillation circuit,
   wherein a gate and a substrate of the field-effect transistor of the frequency adjustment circuit are driven with a constant voltage.

2. The oscillation device according to claim 1, further comprising:
   a control signal output circuit adapted to output a control signal with the constant voltage,
   wherein the gate of the field-effect transistor used in the switch is connected to the control signal output circuit, and the control signal with the constant voltage is input to the gate of the field-effect transistor used in the switch, and
   the substrate of the field-effect transistor used in the switch is connected to the constant voltage circuit.

3. The oscillation device according to claim 2, wherein the switch is formed of a transmission gate having a P-channel MOSFET and an N-channel MOSFET connected in parallel to each other,
   the adjusting capacitance is connected in series between the transmission gate and a ground,
   a gate of the P-channel MOSFET is connected to the control signal output circuit, and a first control signal with a constant voltage is input to the gate of the P-channel MOSFET,
   a voltage with a higher potential out of a constant voltage VREG applied from the constant voltage circuit and a ground potential is applied to a substrate of the P-channel MOSFET,
   a gate of the N-channel MOSFET is connected to the control signal output circuit, and a second control signal with a constant voltage obtained by reversing the first control signal is input to the gate of the N-channel MOSFET, and
   a voltage with a lower potential out of the constant voltage VREG applied from the constant voltage circuit and the ground potential is applied to a substrate of the N-channel MOSFET.

4. A timepiece with temperature compensation function, comprising:
   the oscillation device according to claim 3;

a temperature sensor adapted to output temperature information;
an arithmetic circuit adapted to calculate a correction amount based on the temperature information;
a frequency adjustment control circuit adapted to control the frequency adjustment circuit based on the correction amount; and
a time display section adapted to display time based on an oscillation signal output from the oscillation device.

5. A timepiece with temperature compensation function, comprising:
the oscillation device according to claim 2;
a temperature sensor adapted to output temperature information;
an arithmetic circuit adapted to calculate a correction amount based on the temperature information;
a frequency adjustment control circuit adapted to control the frequency adjustment circuit based on the correction amount; and
a time display section adapted to display time based on an oscillation signal output from the oscillation device.

6. The oscillation device according to claim 1, wherein the oscillation circuit is configured including the field-effect transistor used as a feedback resistor, and
the gate and the substrate of the field-effect transistor used as the feedback resistor are driven with a constant voltage applied by the constant voltage circuit.

7. A timepiece with temperature compensation function, comprising:
the oscillation device according to claim 6;
a temperature sensor adapted to output temperature information;
an arithmetic circuit adapted to calculate a correction amount based on the temperature information;
a frequency adjustment control circuit adapted to control the frequency adjustment circuit based on the correction amount; and
a time display section adapted to display time based on an oscillation signal output from the oscillation device.

8. The oscillation device according to claim 1, wherein the frequency adjustment circuit is configured to include the field-effect transistor, wherein
the constant voltage circuit is configured such that the constant voltage is set to decrease as temperature rises in response to a threshold voltage of the field-effect transistor decreasing as the temperature rises, and
the constant voltage circuit is configured such that the constant voltage is set to increase as temperature rises in response to a the threshold voltage of the field-effect transistor increasing as the temperature rises.

9. A timepiece with temperature compensation function, comprising:
the oscillation device according to claim 8;
a temperature sensor adapted to output temperature information;
an arithmetic circuit adapted to calculate a correction amount based on the temperature information;
a frequency adjustment control circuit adapted to control the frequency adjustment circuit based on the correction amount; and
a time display section adapted to display time based on an oscillation signal output from the oscillation device.

10. A timepiece with temperature compensation function, comprising:
the oscillation device according to claim 1;
a temperature sensor adapted to output temperature information;
an arithmetic circuit adapted to calculate a correction amount based on the temperature information;
a frequency adjustment control circuit adapted to control the frequency adjustment circuit based on the correction amount; and
a time display section adapted to display time based on an oscillation signal output from the oscillation device.

11. The oscillation device according to claim 1, further comprising at least one of a capacitor and a resistor connected between the oscillation inverter and the field-effect transistor.

12. The oscillation device according to claim 1, wherein the resonator and the oscillation circuit are connected through at least one of a resistor and a capacitor.

13. An oscillation device comprising:
an oscillation circuit including an oscillation inverter, and configured to oscillate a resonator;
a frequency adjustment circuit configured to perform frequency adjustment of the oscillation circuit;
a constant voltage circuit configured to drive the oscillation circuit,
wherein in the oscillation circuit and the frequency adjustment circuit, a gate and a substrate of a field-effect transistor of the frequency adjustment circuit having a connection relationship with one of a gate and a drain of the oscillation inverter are driven with a constant voltage, wherein the oscillation inverter is connected to the field effect transistor, and wherein the oscillation inverter is connected to the resonator; and
a control signal output circuit configured to output a control signal with a constant voltage,
wherein the frequency adjustment circuit includes
a switch provided with the field-effect transistor connected to one of the gate and the drain of the oscillation inverter, and
an adjusting capacitance, connection of which to the oscillation circuit is switched by the switch, and
wherein the gate of the field-effect transistor used in the switch is connected to the control signal output circuit, and the control signal with the constant voltage is input to the gate of the field-effect transistor used in the switch,
the substrate of the field-effect transistor used in the switch is connected to the constant voltage circuit,
the switch is formed of a transmission gate having a P-channel MOSFET and an N-channel MOSFET connected in parallel to each other,
the adjusting capacitance is connected in series between the transmission gate and a ground,
a gate of the P-channel MOSFET is connected to the control signal output circuit, and a first control signal with a constant voltage is input to the gate of the P-channel MOSFET,
a voltage with a higher potential out of a constant voltage VREG applied from the constant voltage circuit and a ground potential is applied to a substrate of the P-channel MOSFET,
a gate of the N-channel MOSFET is connected to the control signal output circuit, and a second control signal with a constant voltage obtained by reversing the first control signal is input to the gate of the N-channel MOSFET, and
a voltage with a lower potential out of the constant voltage VREG applied from the constant voltage circuit and the ground potential is applied to a substrate of the N-channel MOSFET.

* * * * *